(12) United States Patent
Clinton et al.

(10) Patent No.: US 7,936,597 B2
(45) Date of Patent: May 3, 2011

(54) MULTILEVEL MAGNETIC STORAGE DEVICE

(75) Inventors: Thomas W. Clinton, Pittsburgh, PA (US); Michael A. Seigler, Pittsburgh, PA (US); Mark W. Convington, Pittsburgh, PA (US); Werner Scholz, Pittsburgh, PA (US)

(73) Assignee: Seagate Technology LLC, Scotts Valley, CA (US)

( * ) Notice: Subject to any disclaimer, the term of this patent is extended or adjusted under 35 U.S.C. 154(b) by 525 days.

(21) Appl. No.: 12/054,775

(22) Filed: Mar. 25, 2008

(65) Prior Publication Data
US 2009/0244957 A1    Oct. 1, 2009

(51) Int. Cl.
*G11C 11/15*   (2006.01)

(52) U.S. Cl. ........ 365/173; 365/130; 365/148; 365/158; 365/225.5; 365/243.5; 977/933; 977/935

(58) Field of Classification Search ............... 365/48, 365/55, 62, 66, 74, 78, 80–93, 100, 130, 365/131, 148, 158, 171–173, 209, 213, 225.5, 365/230.07, 232, 243.5; 216/22; 257/421, 257/E21.665; 438/3; 428/810–816, 817–825.1, 428/826; 977/933–935
See application file for complete search history.

(56) References Cited

U.S. PATENT DOCUMENTS

| | | | |
|---|---|---|---|
| 5,495,438 A | 2/1996 | Omura | |
| 5,668,754 A | 9/1997 | Yamashita | |
| 5,999,438 A | 12/1999 | Ohsawa | |
| 6,438,019 B2 | 8/2002 | Hartner et al. | |
| 6,456,524 B1 | 9/2002 | Perner et al. | |
| 6,541,375 B1 | 4/2003 | Hayashi et al. | |
| 6,589,367 B2 | 7/2003 | Nomura et al. | |
| 6,639,823 B2 | 10/2003 | Hasegawa | |
| 6,704,218 B2 | 3/2004 | Rickes et al. | |
| 6,744,086 B2 | 6/2004 | Daughton et al. | ............ 257/295 |
| 6,753,561 B1 | 6/2004 | Rinerson et al. | ............... 257/295 |
| 6,834,005 B1 | 12/2004 | Parkin | ............... 365/80 |
| 6,856,534 B2 | 2/2005 | Rodriguez et al. | |
| 6,898,132 B2 | 5/2005 | Parkin | ............... 365/189.12 |
| 6,920,060 B2 | 7/2005 | Chow et al. | |
| 6,920,062 B2 | 7/2005 | Parkin | ............... 365/158 |
| 6,967,858 B2 | 11/2005 | Kang | |
| 6,985,385 B2 | 1/2006 | Nguyen et al. | ............... 365/173 |
| 7,031,178 B2 | 4/2006 | Parkin | ............... 365/80 |
| 7,060,586 B2 | 6/2006 | Li et al. | |
| 7,108,797 B2 | 9/2006 | Chen et al. | ............... 216/22 |
| 7,126,841 B2 | 10/2006 | Rinerson et al. | ............... 365/148 |
| 7,170,775 B2 | 1/2007 | Lin et al. | ............... 365/158 |

(Continued)

OTHER PUBLICATIONS

Persev et al., N.A.; Coercive field of ultrathin Pb(Zr0.52TI0.48) epitaxial films, Applied Physics Letters, V. 83, N. 16, Oct. 20, 2003, pp. 3356-3358.
Meyer & Waser, R. & R.; "Hysteretic Resistance Concepts in Ferroelectric Thin Films," Journal of Applied Physics, American Institute of Physics, 2006, pp. 051611-051611-8.
Velev et al., J.P.; "Effect of Ferroelectricity on Electron Transport in Pt/BaTiO3/Pt Tunnel Junctions," The American Physical Society, 2007, pp. 137201-1-137201-4.
Zhuravlev et al., M.Ye.; "Giant Electroresistance in Ferroelectric Tunnel Junctions," Physical Review Letters, The American Physical Society, 2005, pp. 246802-1-246802-4.

(Continued)

*Primary Examiner* — Richard Elms
*Assistant Examiner* — Harry W Byrne
(74) *Attorney, Agent, or Firm* — Fellers, Snider, et al.

(57) ABSTRACT

The present invention includes a memory configured to store data having a pinned layer and a plurality of stacked memory locations. Each memory location includes a nonmagnetic layer and a switchable magnetic layer. The plurality of stacked memory locations are capable of storing a plurality of data bits.

29 Claims, 13 Drawing Sheets

U.S. PATENT DOCUMENTS

| | | | |
|---|---|---|---|
| 7,190,611 B2 | 3/2007 | Nguyen et al. | 365/158 |
| 7,196,924 B2 | 3/2007 | Lai et al. | |
| 7,230,844 B2 | 6/2007 | Deak | 365/171 |
| 7,236,394 B2 | 6/2007 | Chen et al. | |
| 7,251,154 B2 | 7/2007 | Hush | |
| 7,286,378 B2 | 10/2007 | Nazarian | |
| 7,304,881 B2 | 12/2007 | Rodriguez et al. | |
| 7,400,027 B2 | 7/2008 | Joung et al. | |
| 7,430,135 B2 * | 9/2008 | Huai et al. | 365/158 |
| 7,433,253 B2 | 10/2008 | Gogl et al. | |
| 2004/0062071 A1 | 4/2004 | Rodriguez et al. | 365/145 |
| 2004/0233744 A1 | 11/2004 | Rodriguez et al. | 365/200 |
| 2006/0226411 A1 | 10/2006 | Lee | 257/2 |
| 2007/0030728 A1 * | 2/2007 | Kent et al. | 365/171 |
| 2008/0273370 A1 | 11/2008 | Keller et al. | |
| 2009/0268506 A1 | 10/2009 | Seigler et al. | |
| 2009/0273972 A1 * | 11/2009 | Han et al. | 365/173 |

OTHER PUBLICATIONS

Kohlstedt et al., H.; "Theoretical Current-Voltage Characteristics of Ferroelectric Tunnel Junctions," Physical Review, The American Physical Society, 2005, pp. 125341-1-125341-10.

"Current-Driven Magnetization Reversal and Spin-Wave Excitation in Co/Cu/Co Pillars", by J.A. Katine et al., *The American Physical Society*, 2000, pp. 3149-3152.

"Time-Domain Measurements of Nanomagnet Dynamics Driven by Spin-Transfer Torques", by I.N. Krivorotov et al., *Science*, Jan. 2005, pp. 228-231.

"Magnetic Configurations and Phase Diagrams of Sub-100-nm NiFe Nanorings", by N. Benatmane et al., *IEEE*, 2007, pp. 2884-2886.

"Finite-Temperature Modeling of Nanoscale Spin-Transfer Oscillators", by S.E. Russek et al., *Physical Review*, 2005, pp. 104425-1-104425-6.

* cited by examiner

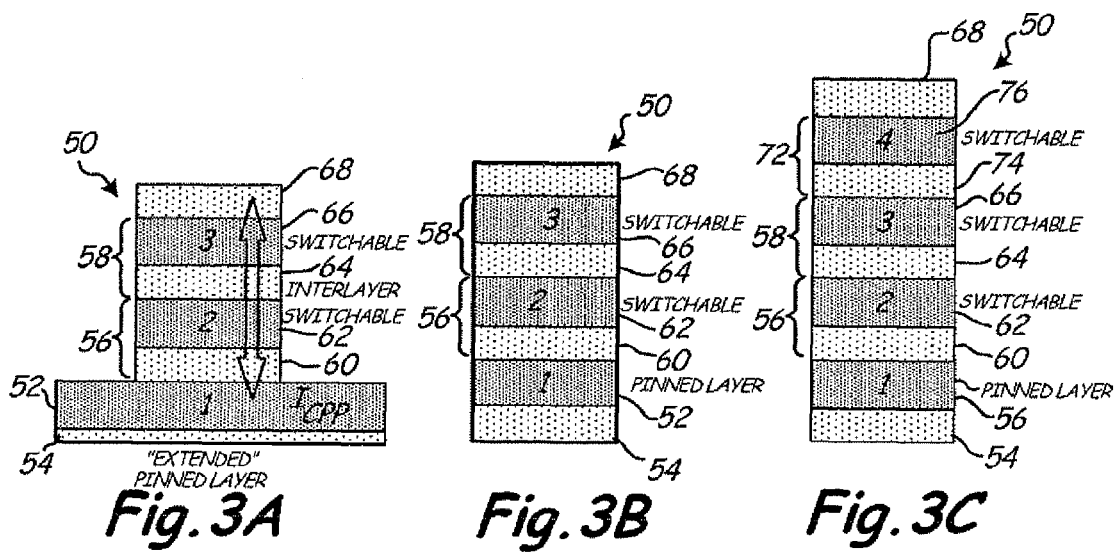
*Fig. 3A*  *Fig. 3B*  *Fig. 3C*
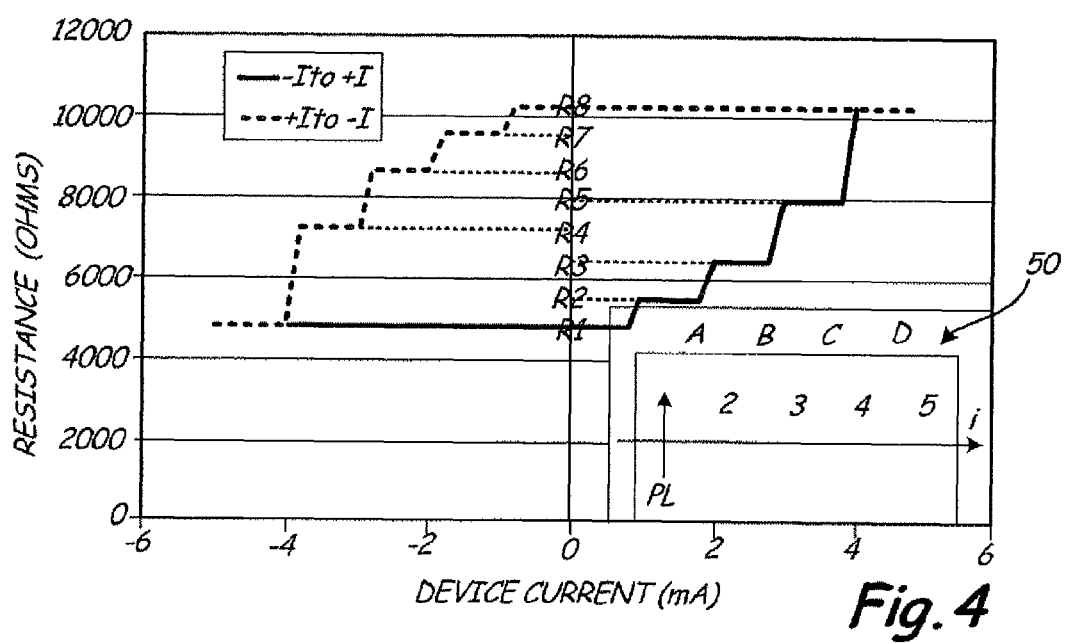
*Fig. 4*

MULTILEVEL MAGNETIC STORAGE DEVICE

BACKGROUND OF THE INVENTION

The present invention relates to a magnetic storage device. More specifically, the present invention relates to a multilevel magnetic solid state storage device.

Magnetic storage devices are widely used in many applications for storing information. One common storage device is a hard disk drive in which a rotating magnetic disk is used to store information which is written and read using a transducer adjacent to the surface of the disk. Other types of memory are solid state memories which use no moving parts. For example, flash memory stores information in an array of transistors which provide a plurality of memory "cells". There is ongoing desire to increase the data storage capacity available in memory devices. This can be achieved, for example, by scaling the dimensions of the device smaller. However, it is often difficult to continue size reduction of a device in order to achieve higher storage density. Further, the physical phenomena that are used to operate storage technologies may be difficult to implement as the size is reduced. In general, both hard disk drive devices as well as solid state memory devices are two-dimensional (2D) in nature in which the data bits are stored side by side and the areal density of the device typically dictates total device capacity. For example, disk drives store bits on the surface of a disk and solid state memory is built as a 2D array on the surface of a chip.

SUMMARY OF THE INVENTION

The present invention includes a memory configured to store data having a pinned magnetic layer and a plurality of stacked memory locations. Each memory location includes a nonmagnetic layer and a switchable magnetic layer. The plurality of stacked memory locations is capable of storing a plurality of data bits.

BRIEF DESCRIPTION OF THE DRAWINGS

FIGS. 3A, 3B and 3C are side cross-sectional views of a memory device in accordance with various embodiments of the present invention.

FIG. 4 is a graph of resistance in ohms versus device current in milliamps.

DETAILED DESCRIPTION OF ILLUSTRATIVE EMBODIMENTS

The present invention provides a plurality of stacked memory location which allows a three-dimensional arrangement of data bits. This allows increased areal storage density as the device is not limited to a two-dimensional array.

A traditional magnetic storage cell has two output levels and stores the equivalent of one bit per cell i.e. a "1" or a "0". There are two stable states, typically represented by opposite polarities of the magnetic free layer, resulting in the two distinct magnetoresistance output levels.

In the present invention, a magnetic memory where multiple storage locations are stacked vertically and may be arrayed to archive bits three dimensionally. The bits are stored vertically in the locations along the stack. When a current is driven through a stack, spin momentum transfer (SMT) results in a torque between neighboring magnetic layers that has the effect of reversing the direction of magnetization of selected layers.

Figure 1:
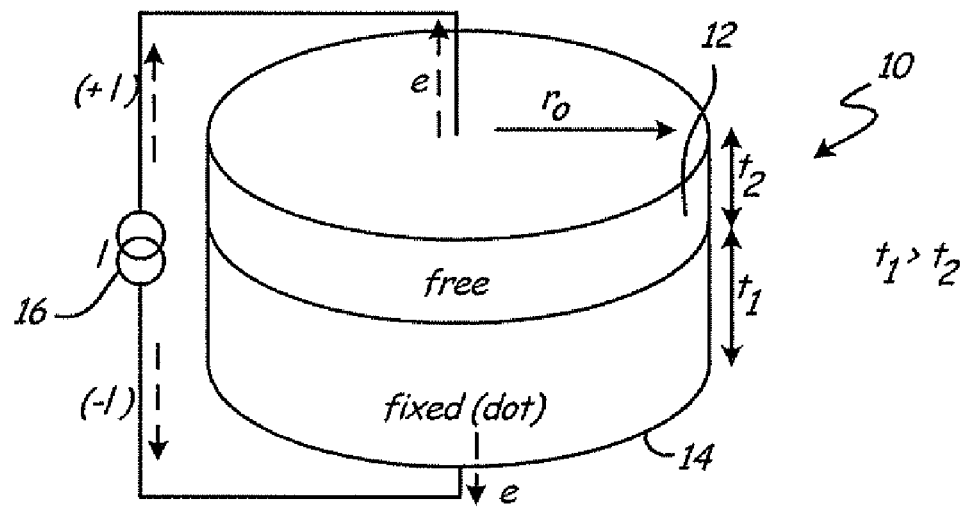
FIG. 1 is a simplified diagram showing two magnetic layers that form the basis for spin torque writing and magnetoresistive read-back via the application of appropriate currents.
Figure 2:
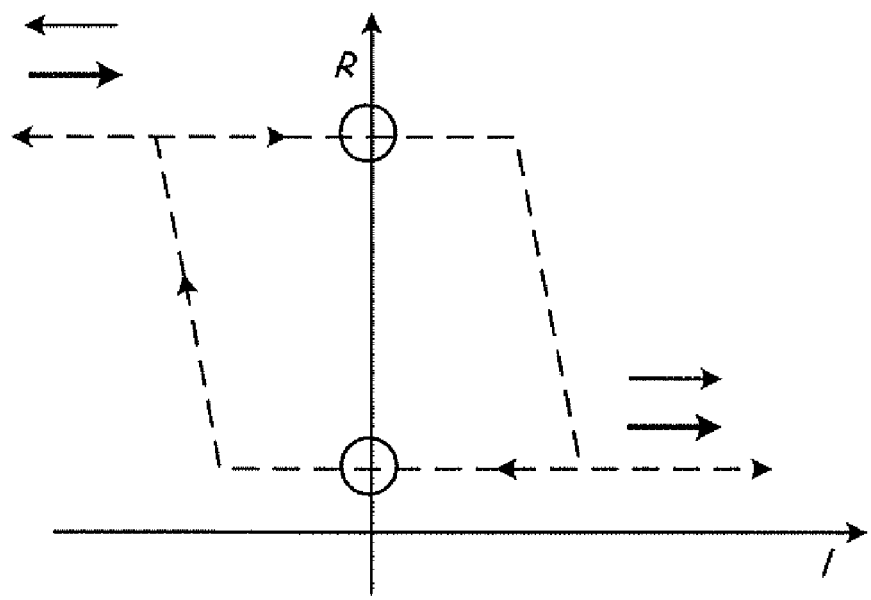
FIG. 2 is a graph of resistance versus current for the memory dot of FIG. 1.

FIG. 1 is a representation of this effect for magnetic dots 10. When a spin-polarized current passes through a magnetic material, the transfer of angular momentum from the spins exerts a torque on the magnetic moment of the material (see, J. A. Katine, et al., Phys. Rev. Lett. 84, 3149 (2000); I. N. Krivorotov, et al., Science 307, 228 (2005)). In magnetic bilayers consisting of a fixed (reference) magnetic layer 14 and a free layer 12 (as depicted in the upper left-hand schematic of FIG. 1, for example), the spin-polarized current transfers angular momentum from the fixed layer 14 to the free layer 12, exerting a torque on the free layer 12. In the example of FIG. 1, the current from current source 16 is driven vertically through the stack, where spin torque drives the free layer 12 parallel to the fixed layer 14 for a positive bias (bottom-to-top electron flow), as shown. This effect is both experimentally observed and theoretically understood (see, J. A. Katine, et al., Phys. Rev. Lett. 84, 3149 (2000); I. N. Krivorotov, et al., Science 307, 228 (2005)). It is now known that spin torque induces magnetization dynamics by opposing the damping torques that force the magnetization to settle into static equilibtrium. Hence, spin torque induced switching occurs via the destabilization of the ferromagnet. The Landau-Lifshitz equation of motion can be applied to describe the free-layer dynamics in response to spin torque by adding an extra term. (see, S. E. Russek et al., Phys. Rev. B, 71, 104425 (2005)):

$$\frac{dM_{free}}{dt} = -\frac{\mu_0 \gamma}{1+\alpha^2} M_{free} \times H - \frac{\mu_0 \gamma \alpha}{M_s(1+\alpha^2)} M_{free} \times (M_{free} \times H) + \frac{\hbar}{2e} \frac{\varepsilon \cdot I}{V} \frac{\gamma}{M_{Sfree}^2 M_{Sfixed}} M_{free} \times (M_{free} \times M_{fixed}) \quad \text{EQ. 1}$$

where I is the current flowing perpendicular to the plane (CPP) of the magnetic layers, $M_{sfree}$ is the free-layer 12 saturation magnetization, $M_{sfixed}$ is the saturation magnetization of the fixed layer 14, E is an efficiency factor related to the spin-polarization of the current, and V is the volume of the free layer 12. The first two terms on the right-hand side of equation 1 are the usual Landau-Lifshitz terms and the third term on the right represents the contribution of spin torque. Solutions to this equation yield a critical current density, $J_c$, beyond which the magnetization of the free layer 12 can be driven either parallel or antiparallel to the fixed layer 14, depending on the direction of current flow. FIG. 2 is a graph of resistance of the location 10 versus current I through the location 10 and shows two stable states. The current density depends on several variables, such as the magnetic field and physical parameters of the free layer 12. For the specific example of a thin film geometry where the pinned and free magnetic layers are magnetized in the thin film plane and a free layer that has in-plane uniaxial anistropy, the critical current density for switching between parallel and antiparallel magnetic configurations scales like $$J_c \propto \alpha t (2\pi M_s + H_K) + H_{ext}, \quad \text{EQ. 2}$$

where $\alpha$ is the free layer 12 Landau-Lifshitz damping coefficient, t is the free layer 12 thickness $t_2$, $M_s$ is the free layer 12 saturation magnetization, $H_K$ is the free layer 12 in-plane uniaxial anisotropy, and $H_{ext}$ is the external field applied along the in-plane anisotropy axis.

With the present invention, a multilevel magnetic solid state memory device is provided. FIGS. 3A, 3B and 3C are side cross-sectional views of embodiments of memory device 50 in accordance with example configurations of the present invention. The memory device 50, also referred to as a memory element stack (MES), includes a pinned layer 52 carried on a nonmagnetic layer 54. In the embodiment of 3A, the pinned layer extends laterally away from the pillar. Device 50 further includes a plurality of memory locations. In the embodiments shown in 3A and 3B, two memory locations 56 and 58 are shown. Memory location 56 comprises a nonmagnetic layer 60 and a switchable magnetic layer 62. Similarly, location 58 comprises a nonmagnetic layer 64 and a switchable magnetic layer 66. A top nonmagnetic layer 68 is also shown. This configuration can also be described as a plurality of switchable magnetic layers which are separated by nonmagnetic interlayers. In a more specific configuration, the switchable magnetic layers are in direct contact with the nonmagnetic layers. FIG. 3B shows a configuration in which the pinned layer 52 does not have an "extended" configuration. FIG. 3C shows an embodiment in which a third memory location 72 is added and formed by nonmagnetic layer 74 and switchable magnetic layer 76.

In FIGS. 3A-3C, layer 1 (52) is a pinned magnetic layer (PL). The magnetization of this layer is not affected by current flowing through the memory 50, or by the magnetic fields from the switchable magnetic layers (SL) such as 62 and 66. This can be achieved using any appropriate technique, for example, an antiferromagnetic or high anisotropy layer can be used in conjunction with a second magnetic layer, hence forming a composite layer where the magnetic pinned layer is magnetically exchange-coupled to the antiferromagnetic or high anistropy layer. Similarly, a single layer having a high anisotropy can be provided. A synthetic antiferromagnetic (SAF) layer can also be used to increase the stability of the pinned layer and/or composite structure.

The layers labeled 2, 3 and 4 (62, 66 and 76, respectively) are switchable magnetic layers. The magnetization of these layers can be switched using spin momentum transfer (SMT) when a current is passed through the MES 50. The orientation of each switchable layer will be determined by the direction and magnitude of the current $I_{CPP}$ illustrated in FIG. 3A. The overall resistance of the MES 50 depends upon the combination of the magnetization orientations of the switchable layers. Note that each switchable layer may comprise multiple layers of magnetic materials to enhance the signal, the stability and other performance parameters of the device. Similarly, the switchable magnetic layers can comprise a synthetic antiferromagnetic layer, comprised of two or more magnetic layers coupled via RKKY coupling, to reduce the effects of magnetostatic fields from one layer on an adjacent layer. The nonmagnetic interlayers may be of any appropriate materials or combination of materials or layers. For example, the interlayers can comprise an insulator to form a tunnel junction, a semi-conductor material to form a tunnel junction or a metal material providing a giant magnetoresistance.

FIG. 4 is a graph of resistance in ohms versus device current in milliamps showing an example transfer curve for a multilevel magnetic solid state memory device 50 illustrated in the inset. The device 50 of FIG. 4 is shown with one pinned layer (PL) and four switchable magnetic layers labeled 2-5. This graph was generated using the parameters set forth in Table 1:

TABLE 1

| Junction | $I_c\_pos$ | $I_c\_neg$ | R_Para | MR | R_AP | DR |
|---|---|---|---|---|---|---|
| D | 1 | −1 | 900 | 80% | 1620 | 720 |
| C | 2 | −2 | 1000 | 90% | 1900 | 900 |
| B | 3 | −3 | 1200 | 120% | 2640 | 1440 |
| A | 4 | −4 | 1700 | 140% | 4080 | 2380 |

In Table 1, R_Para is the resistance when the two magnetic layers on opposite sides of a nonmagnetic layer have parallel orientations, MR is the magnetoresistance ratio (DR/R_P), R_AP is the resistance when the layers are oriented antiparallel, DR is delta R (the change in resistance), and $I_c\_pos$ and $I_c\_neg$ are the current levels (increasing or decreasing) along the graph of FIG. 4 where the SMT is large enough to switch that particular switchable layer. The transfer curve shown in FIG. 4 is for a device having a single pinned layer and four switchable layers and can be used to describe the general operation of the device. However, any number of switchable magnetic layers may be employed and the invention is not limited to the examples set forth herein.

Referring to FIG. 4, in this example it is assumed the Ic_A is the critical current that must be applied in order to male layer 2 either parallel (−Ic_A) or antiparallel (+Ic_A) relative to the pinned layer. It is assumed that the positive and negative switching currents have the same magnitudes. Further, it is assumed that the critical currents are positive quantities and obey the following inequalities Ic_A>Ic_B>Ic_C>Ic_D. DRA is the change in electrical resistance when layer 2 changes magnetic orientation with respect to layer 1. Similarly, DRB is the change in resistance when layer 3 changes orientation with respect to layer 2. It is assumed that DRA>DRB>DRC>DRD. Note that these assumptions may not be necessary for operation of the device and are provided for explanation purposes.

Referring to the graph of FIG. 4, the following steps can be taken with the memory device 50 to bring the device 50 through one complete transfer curve:

Apply a large negative current (I<−Ic_A whereby electrons flow from left to right, referring to the structure depicted in the inset at the bottom righthand of FIG. 4) to cause the magnetization of layers 1 through 5 to all be aligned parallel due to spin momentum transfer. This will place the device in its lowest resistance state identified as R1 in FIG. 4. If the current is reduced to zero, the resistance is stable and continues to have the value of R1.

Apply a positive current Ic_D<I<Ic_C to cause the magnetization of layer 5 to switch direction and become antiparallel to layer 4. However, only layer 5 will switch direction and layers 1-4 will maintain their orientations. This will increase the resistance of the device from R1 to R2 (where R2=R1+DRD). If the current is reduced to 0, the device will maintain the resistance of R2 and be stabilized.

Apply a positive current of Ic_C<I<Ic_B to cause layer 4 to switch to become antiparallel to layer 3, without changing the orientation of the remaining layers. In order to maintain the relative orientations, layer 5 will switch when layer 4 switches because I>Ic_D. This will increase the resistance of the device from R2 to R3 (R3=R1+DRD+DRC). The device will now have a resistance that will be stable at R3.

A positive current is applied Ic_B<I<Ic_A causing layer 3 to switch to being antiparallel to layer 2. However, the remaining layers will maintain their relative orientations. In order to maintain their relative orientations, layer 4 and 5 will switch when layer 3 switches because I>Ic_D and I>Ic_C. This will increase the resistance of the device from R3 to R5 (R5=R1+DRD+DRC+DRB). The device will now have a resistance which is stable at R5.

A positive current is applied I>Ic_A to cause layer 2 to switch to being antiparallel to layer 1 while the remaining layers will maintain their relative orientations. Thus, layers 3, 4 and 5 will switch orientations when layer 2 switches because I>Ic_B>Ic_C>Ic_D. This will increase the resistance of the device from R5 to R8 (R8=R1+DRD+DRC+DRB+DRA). The device will now have a resistance which is stable at R8 which is the highest resistance state for the device.

Next, the device is brought back through the left hand side of the curve shown in FIG. 4 by applying a negative current −Ic_D>I>−Ic_C to cause layer 5 to switch to being parallel to layer 4 while the other layers maintain their orientations. This will decrease the resistance of the device from R8 to R7 (R7=R8−DRD). If the current is increased to zero, the device will have a stable resistance at R7.

A negative current −Ic_C>I>−Ic_B is applied causing layer 4 to switch to being parallel to layer 3 while the remaining layers maintain their relative orientations. Thus, layer 5 will switch when layer 4 switches because I<−Ic_D. This will decrease the resistance of the device from R7 to R6 which equals R8−DRD−DRC. If the current is now increased to zero, the device will have a resistance which is stable at R6.

A negative current −Ic_B>I>−Ic_A is applied causing layer 3 to switch to become parallel to layer 2 while the remaining layers maintain their relative orientations. Therefore, layers 4 and 5 will switch when layer 3 switches because I<−Ic_D and I<−Ic_C. This will decrease the resistance of the device from R6 to R4 (R4=R8−DRD−DRC−DRB). With the current increased to 0, the device will have resistance R4 and this will be a stable resistance state.

Finally, a negative current I<−Ic_A will cause layer 2 to switch to being parallel with layer 1 while the remaining layers will maintain their relative orientations, thus layers 5, 4 and 3 will switch when layer 2 switches because I<−Ic_D, I<−Ic_C and I<−Ic_B. This will decrease the resistance of the device from R4 to R1 which is equal to R8−DRD−DRC−DRB−DRA. If the device current is now increased to 0, the device will have a resistance which is again stable at R1, the lowest resistance state of the device.

Note that the above discussion resulted in 2N states, where N is the number of switchable layers. In order to achieve 2N levels, the DR values must be chosen appropriately such that there are no degenerate resistance states. It may be necessary to pre-read the device if other data bits in the device need to be preserved. Alternatively, blocks of data may be written at the same time such that a pre-read is not necessary. Instead, a simple reset is performed before writing where the reset would include applying a large positive or negative current. For example, by applying I>Ic_A or −I>Ic_A before writing a bit, then the write current would be a single current value. Alternatively, the data in the device could be read prior to writing and the current sequence to reach the desired state could be determined. The current sequence could be one or multiple current values.

Note that many more states may be achieved if minor loops are allowed. For example, if the following current sequence is applied to the device, it can result in another state in addition to the eight states described above:

Apply current I>Ic_A, apply current −I where Ic_B<−I<Ic_A, apply a current Ic_D<I<Ic_C. This yields a resistance state which is between R4 and R5.

The number of states which can be achieved for a given number of switchable layers depends on controlling the DR values. If a sufficient number of nondegenerate resistance states can be achieved, and the design allows for the application of multiple current pulses, $2^N$ levels can be achieved where N is the number of switchable layers. The number of switchable layers depends upon how well the critical currents levels can be controlled.

In the extreme case, an entire 8 bits ($2^{8=256}$ states) may be held in a single memory device having 8 switchable layers. For example, a single device may have 8 switchable layers where a high resistance state corresponds to a 1 and a low resistance state corresponds to a 0. The most complex state would be 01010101, where the left most 0 would be junction A and the right most would be "H". In this example, Ic_A>Ic_B>Ic_C>Ic_D>Ic_E>Ic_F>Ic_G>Ic_H. This data could be written by applying 8 currents in the following order:
1) I<−Ic_A
2) Ic_B<I<Ic_A
3) −Ic_C>I>−Ic_B
4) Ic_D<I<Ic_C
5) −Ic_E>I>−Ic_D
6) Ic_F<I<Ic_E
7) −Ic_G>I>−Ic_F
8) I>Ic_H In such a configuration, the critical current for each junction can be controlled by parameters such as the thickness of the switchable layers, the magnetic and anisotropy, saturation magnetization and magnetic damping rate (which may be parameterized by the Landau-Lifshitz-Gilbert coefficient α). The critical current levels can also be controlled by controlling the thickness and the material used for the interlayer. The magnetoresistance of each junction can be controlled by these parameters along with the current polarization.

Figure 5:
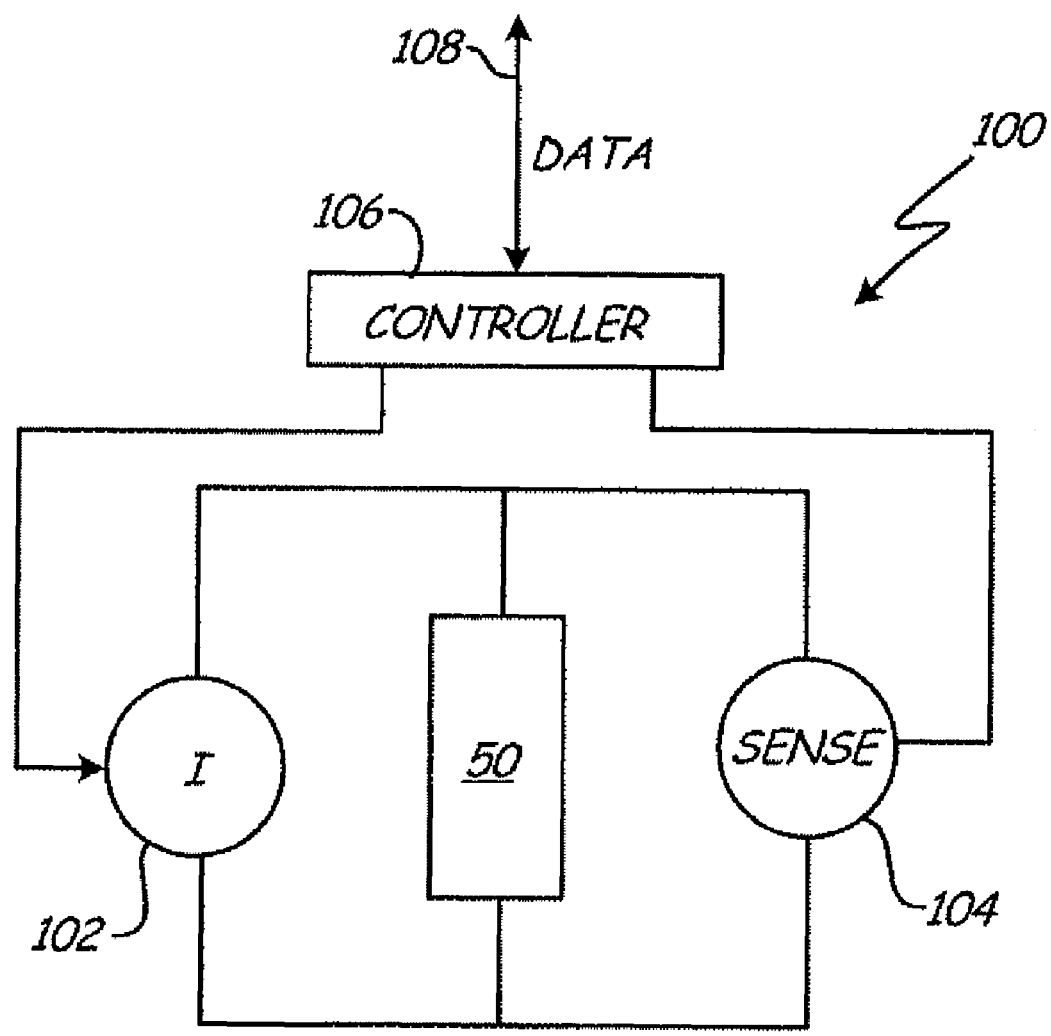
FIG. 5 is a simplified block diagram showing a data storage system using a memory device of the present invention.

FIG. 5 is a simplified block diagram of a data storage system 100 which is used in conjunction with memory device 50. The data storage device 100 includes a current source 102 and a sensor 104. Sensor 104 can comprise, for example, a voltage sensor which can be used to measure the resistance of device 50. A controller 106 couples to current source 102 and sensor 104 and can be used for reading or writing data using the techniques described above. The data may then be sent or received on a data bus 108. The controller can be implemented in appropriate digital circuitry and used to step the device 50 through the various resistance states.

In one configuration, the present invention provides a memory 50 configured to store data which includes a pinned layer 52; a plurality of stacked memory locations 56,58 each including a nonmagnetic layer 60,64 and a switchable magnetic layer 62,66. Each location has a first and a second resistance state. A current source 102 is coupled to the plurality of memory locations and configured to provide a recording current to the plurality of memory locations and thereby switch at least one of the plurality of memory locations from a first resistance state to a second resistance state and thereby store a digital value. A sensor 104 is coupled to the plurality of memory locations and is configured to sense a resistance of the plurality memory locations and thereby retrieve the stored digital value.

In another embodiment of the present invention, a magnetic memory is provided where multiple storage locations are stacked vertically and may be arrayed to archive bits three dimensionally. The bits are stored vertically in the locations along the stack. When a current is driven through a stack, spin momentum transfer (SMT) results in a torque between neighboring magnetic layers that has the effect of either reversing or stabilizing the a magnetization orientation of selected layers.

Figure 6:
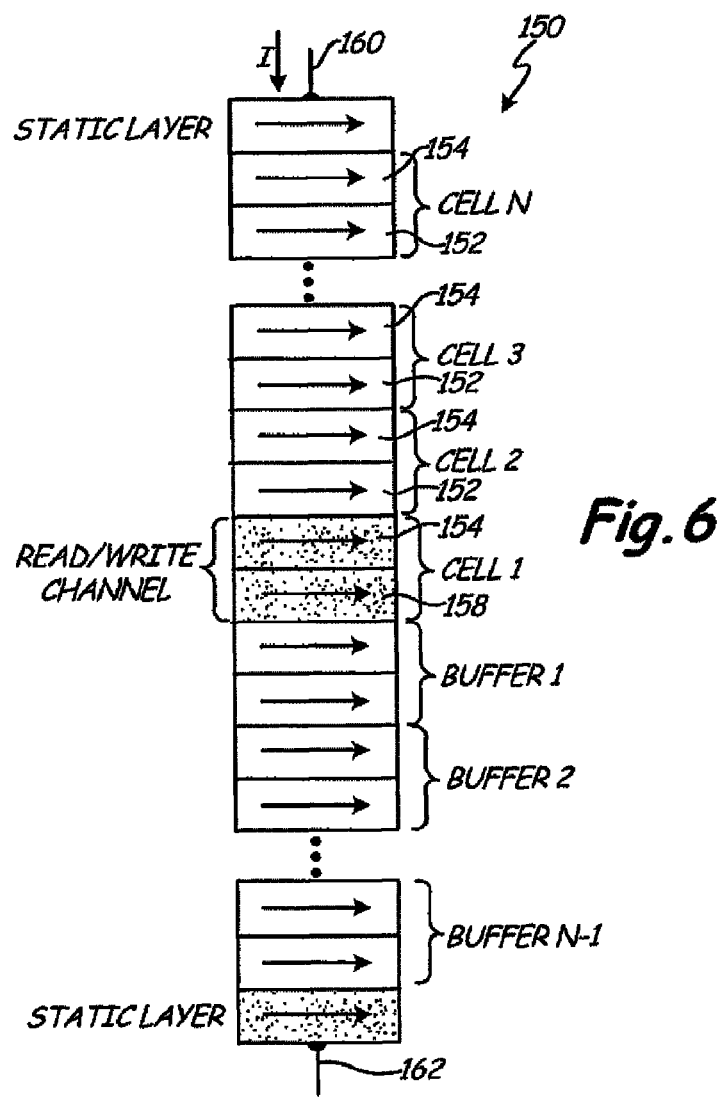
FIG. 6 is a simplified diagram of a memory stack.
Figure 7:
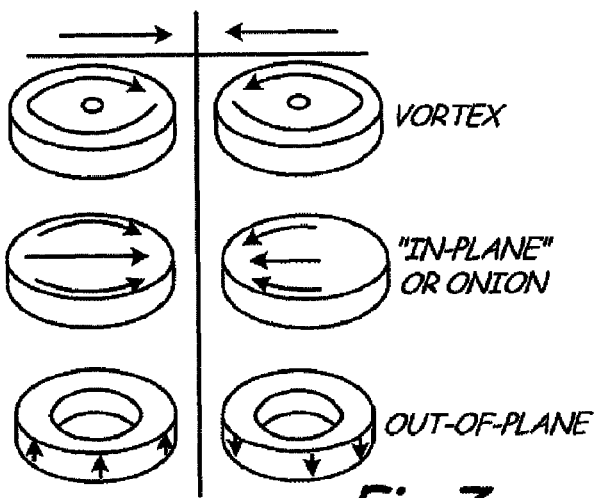
FIG. 7 depicts several example magnetization states for a magnetic dot or ring.

FIG. 6 is a schematic depiction of an N-bit memory stack 150 in accordance with one embodiment of the invention shown in an initially DC erased state (all "0"'s, for example). The stack 150 consists of a read/write channel, N locations (including one storage location in the read/write channel), N−1 buffer layers or locations, and static layers at the top and bottom of the stack. Each cell 1 through N consists of at least two magnetic layers 152, 154. A bit is made up of at least two magnetic layers that are maintained with the same magnetization orientation. Bits can propagate within the stack while the locations can be viewed as being at fixed locations in a stack 150. The read/write channel for the stack 150 can operate based upon a geometry much like that of FIG. 1, by driving the two opposite-polarity magnetization states using the SMT effect from current I driven vertically through a multilayer structure 150 (writing the bit) between terminals 160,162. These same two terminals 160,162 can be used to read the magnetoresistive output of a device 150 (reading the bit). This is represented by the graphs of FIG. 2, where the 2-level magnetoresistive output versus current through the stack (R-I loop) is shown, along with the corresponding magnetic orientations. The reference (static) layer (bottom layer in the example) is in a fixed magnetization orientation, which can be achieved either by making its thickness large (large magnetic volume) compared to that of the free layer, or by pinning it using established techniques.

Figure 8:
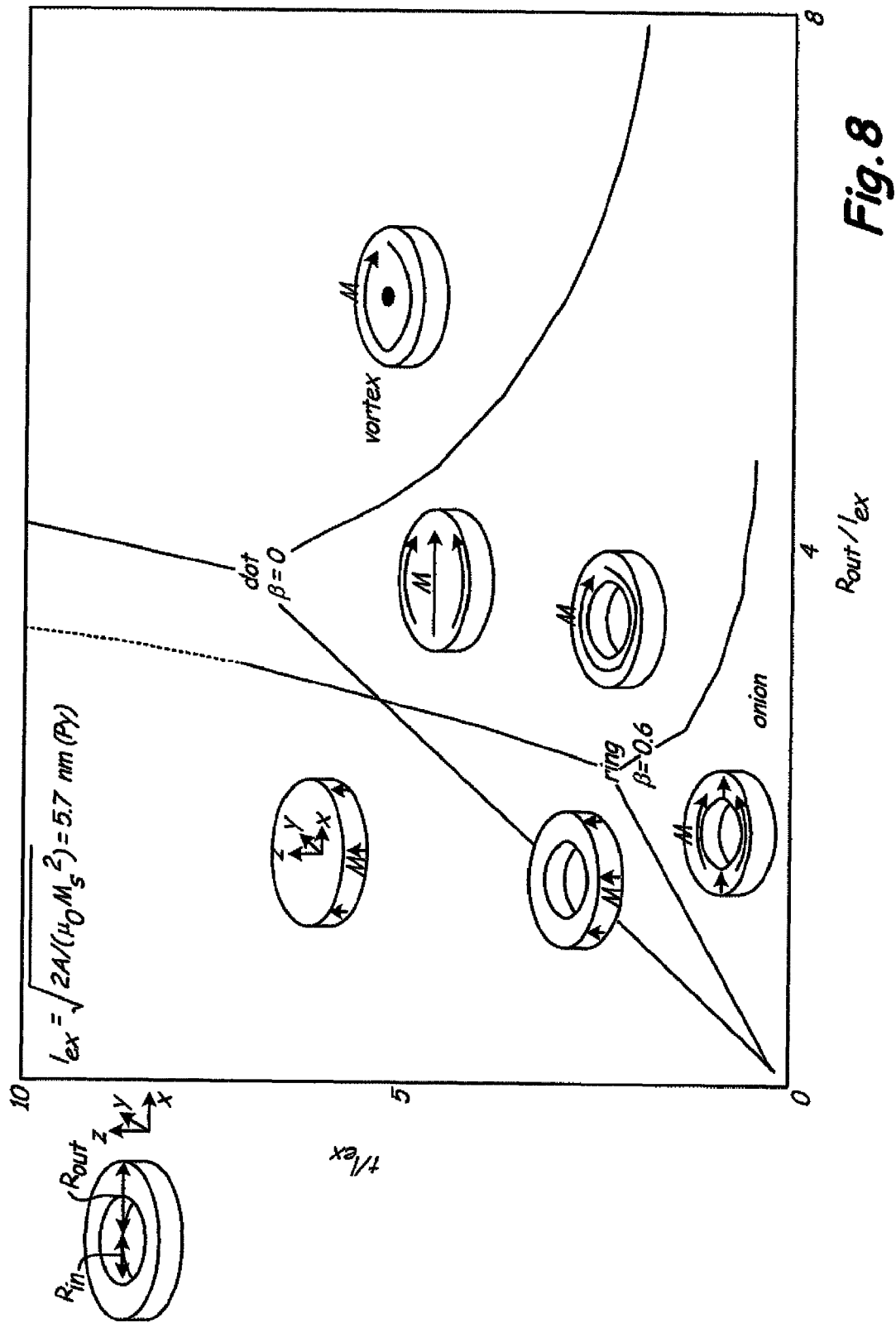
FIG. 8 is a graph showing a phase diagram for a magnetic ring or dot.

The magnetization layers 152,154, depicted as horizontal arrows in FIG. 6, can be fabricated in a variety of ways. For example, FIG. 8 depicts several well defined magnetization states for a magnetic dot (or ring) that can be established and stabilized by materials, structural and geometric design: a vortex state; an in-plane or onion state; an out-of plane state. More specifically, FIG. 8 graphically represents the geometric phase diagram for a dot (and ring), where the magnetic phase is shown as a function of film thickness t and radius ($R_{out}$) for a dot and ring. (See, Nadjib Benatmane, Werner Scholz, and T. W. Clinton, "Magnetic Configurations and Phase Diagrams of sub-100 nm NiFe Nanorings", IEEE Trans. Magn. 43 (2007) 2884-2886). The vortex state has the lowest magnetostatic energy, which makes this state well suited for a high-density of locations where magnetostatic interactions can render bits unstable. These specific states are described and are known in the field. However, the invention can operate with other magnetization states that can be engineered by way of material, geometry and structure.

Figure 9:
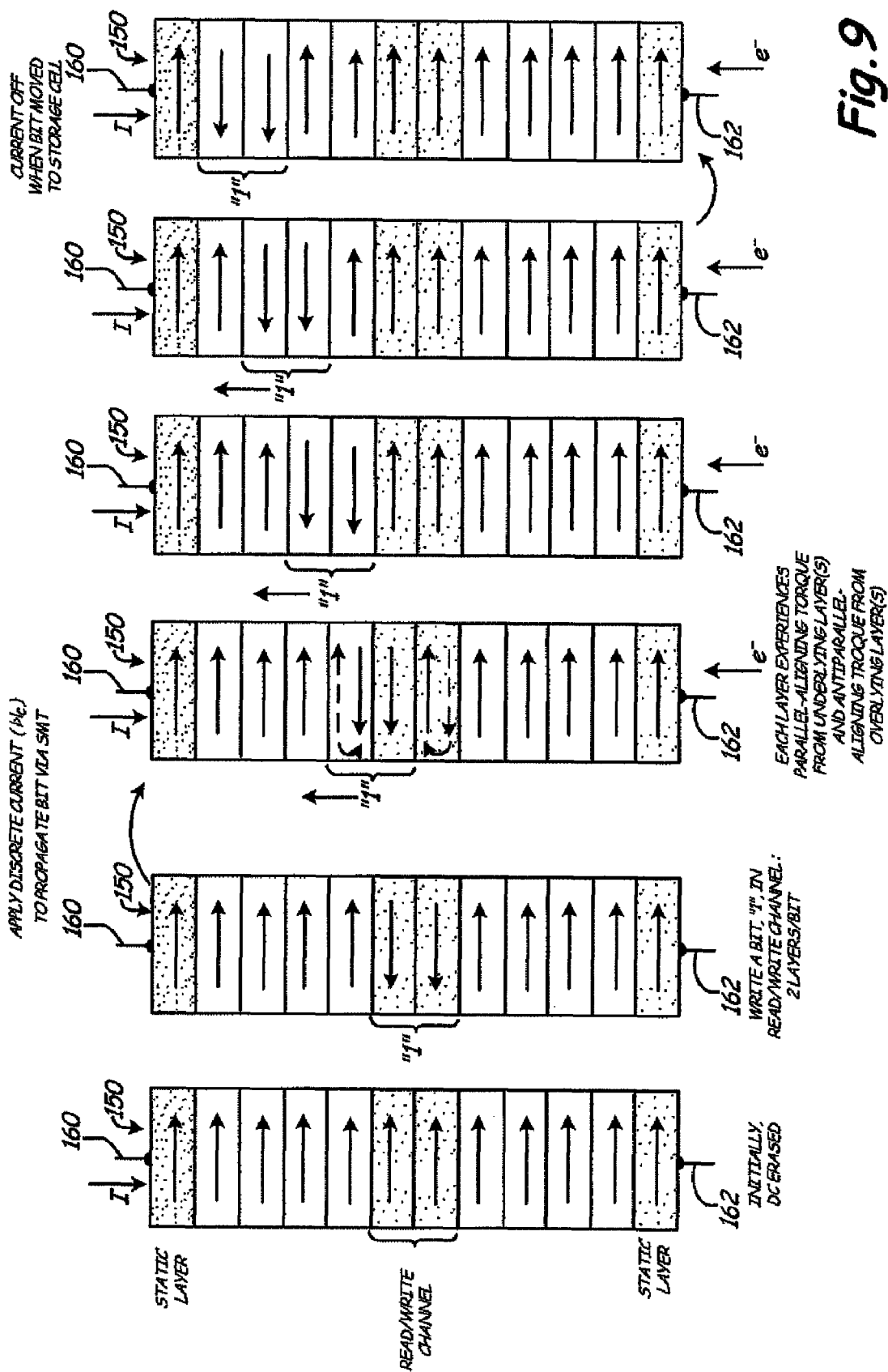
FIG. 9 illustrates propagation of a data bit through a memory stack.

FIG. 9 is an example showing propagation of a bit through stack 150. The left-hand schematic depicts the initial DC erased state of a 3-bit stack 150, for example. Following the diagram from left to right, a bit is then written in the read/write channel by driving the appropriate magnetization orientations of both layers of cell-1 (via SMT), which can be achieved independent of the initial state of this location, i.e., the location-1 does not need to be pre-read. For clarity, the bit is created having a magnetization polarity opposite the DC erased orientation and refer to it as a "1" in this example.

A current I is driven through the stack (via top and bottom electrodes 160,162) such that electron flow is from bottom to top, which results in each layer experiencing parallel-aligning torques from underlying layers and antiparallel-aligning torques from overlying layers. Adding up torques for a given layer (and weighting a nearest neighbor torque more strongly than the next nearest, etc.), suggests that two layers in particular will experience a net antiparallel torque (as shown in the third diagram from left of FIG. 9). If the current density is large enough as discussed above, SMT can reverse the magnetization of those layers. This results in the bit propagating upward by half a location. As the current is further applied at the appropriate level, the same mechanism propagates the bit up another half-location as shown in the fourth diagram from the left. Now the bit has moved a complete location, from cell 1 to cell 2, and has moved completely out of the read/write channel. This process can continue until the bit is positioned at the third and last location (for this example) by turning the current off at the appropriate time, as illustrated in the fifth and sixth diagrams from the left. Although the magnetization in a layer with a left or right pointing arrow is shown, this actually represents a variety of magnetization states and their (equally-stable) opposite polarities (or chiralities).

The propagation of a random bit sequence is possible if at least two layers per bit (and location) are used, but can break down for single layer bits. The additional layer(s) is a necessary control to insure that there is sufficient torque to reverse a layer, when appropriate, and sustain bit propagation. This process is analogous to domain wall (DW) motion in magnetic wires, which forms the basis for a shift-register like 3D memory. (U.S. Pat. Nos. 6,834,005; 6,898,132; 6,920,062). However, the descretization of the propagation is one advantage of the present invention, where the location length is highly controlled (by layer thickness, for example) and less susceptible to degradation as with domain wall based systems where the domain walls are known to change form with motion. Another advantage of the present invention is that the magnetization states of bits can be readily engineered to take many forms (as opposed to linear, or homogeneous, magnetization states between domain walls), such as a vortex state which has minimal magnetostatic interaction with neighbors, thereby enabling greater thermal stability and density of bits.

Figure 10:
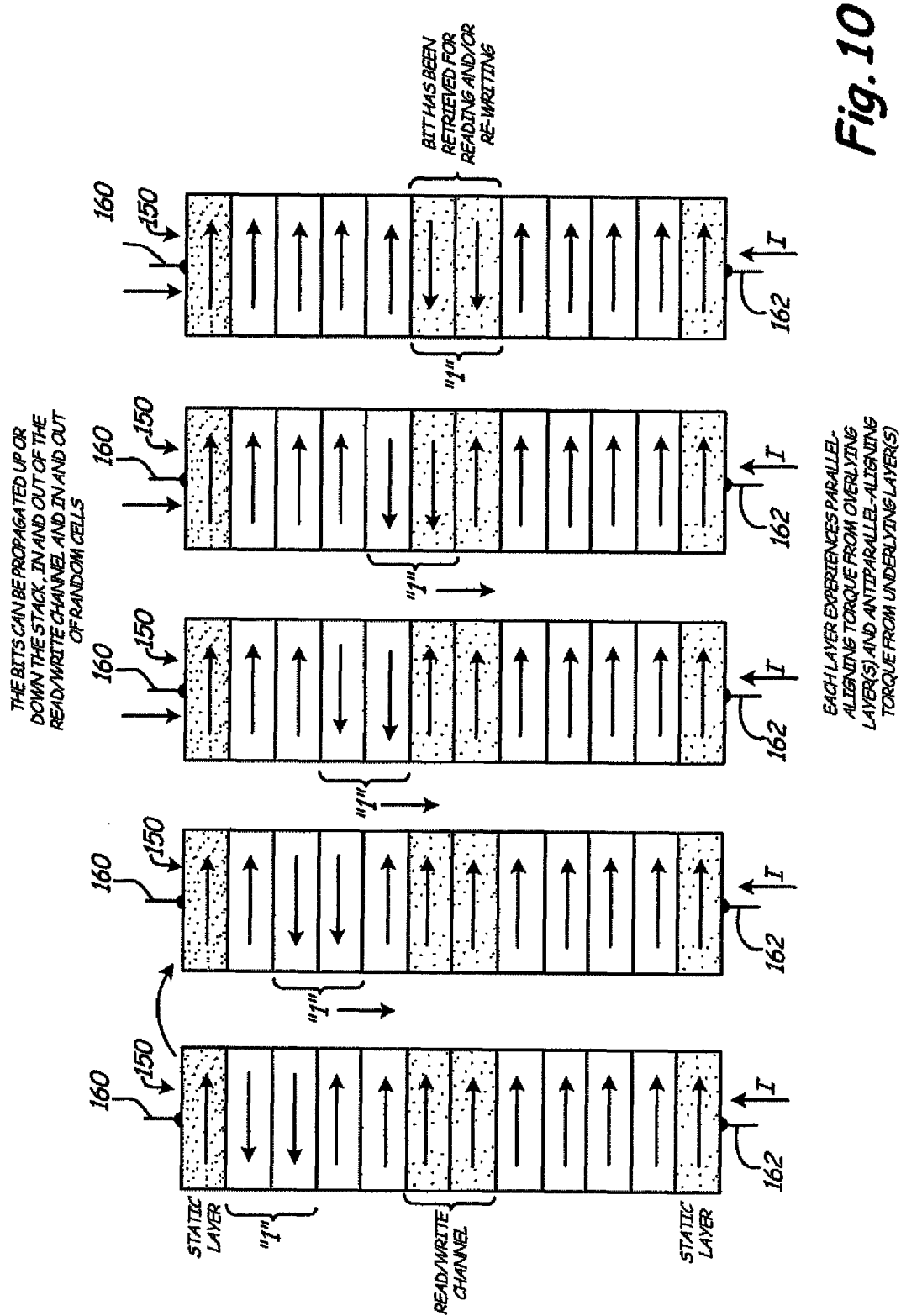
FIG. 10 shows the reverse propagation of a bit through the stack.

The diagrams of FIG. 10 step through the process of reversing the propagation of a bit and driving the bit of FIG. 9 back into the read/write channel, where it can be read, re-written, or simply stored. The reversal of propagation can be achieved by reversing the current polarization, where the same physical phenomena discussed above applies. The reversal of the electron flow now requires that each layer experiences a parallel-aligning torque from overlying layers, and an antiparallel-aligning torque from underlying layers.

Figure 11:
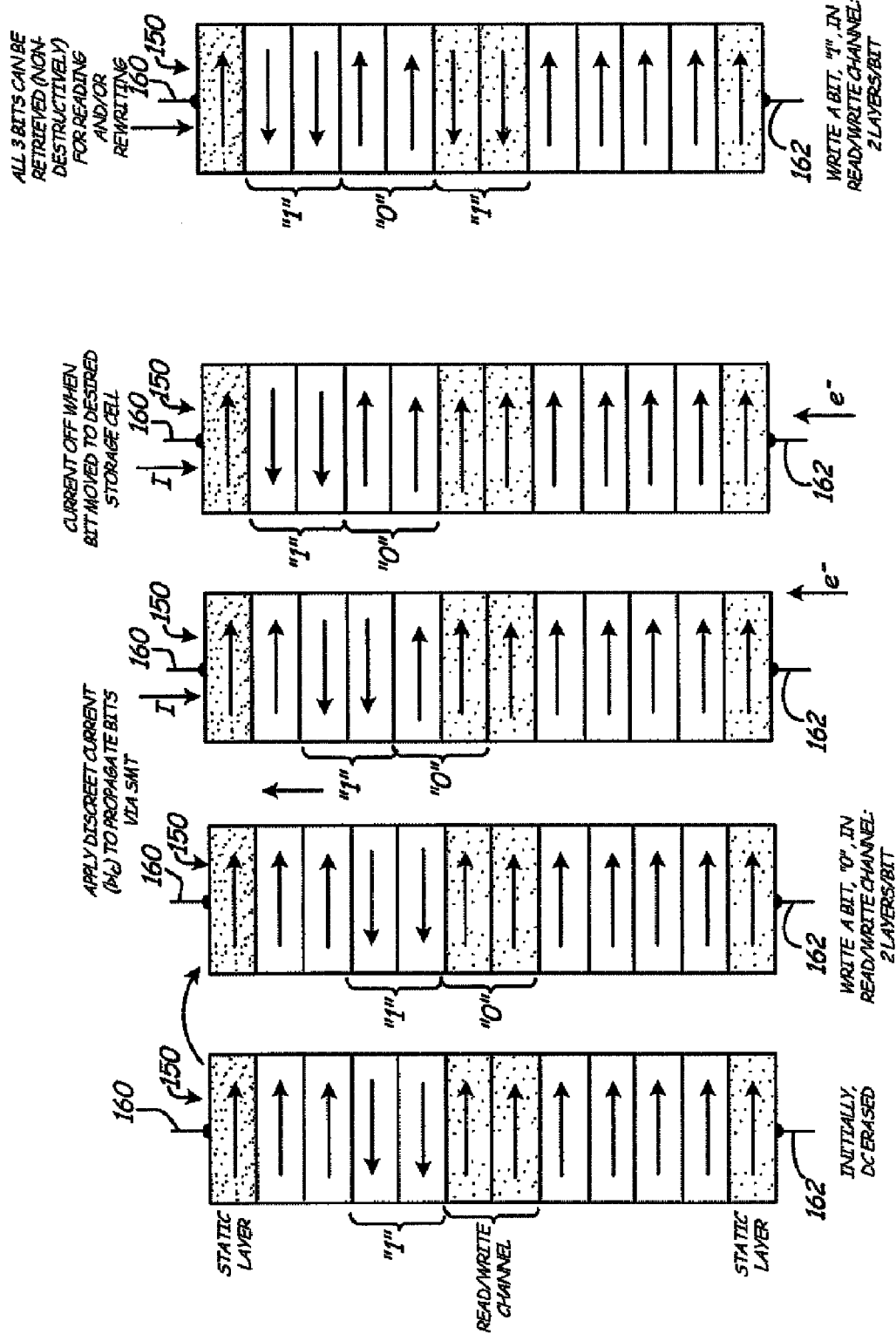
FIG. 11 shows steps for storing three bits in the stack.

FIG. 11 extends the process to storing three-bits for this example. The first diagram (from left) has a "1" stored in cell-2, placed according to the process detailed above. A "0" is then written at the read/write channel in cell-1, as shown in the second diagram from the left of FIG. 11. Both bits are then propagated a half location at a time until they are shifted one location, at which point the first location is "empty" and a third bit is written as a "1", and the register is full.

Figure 12:
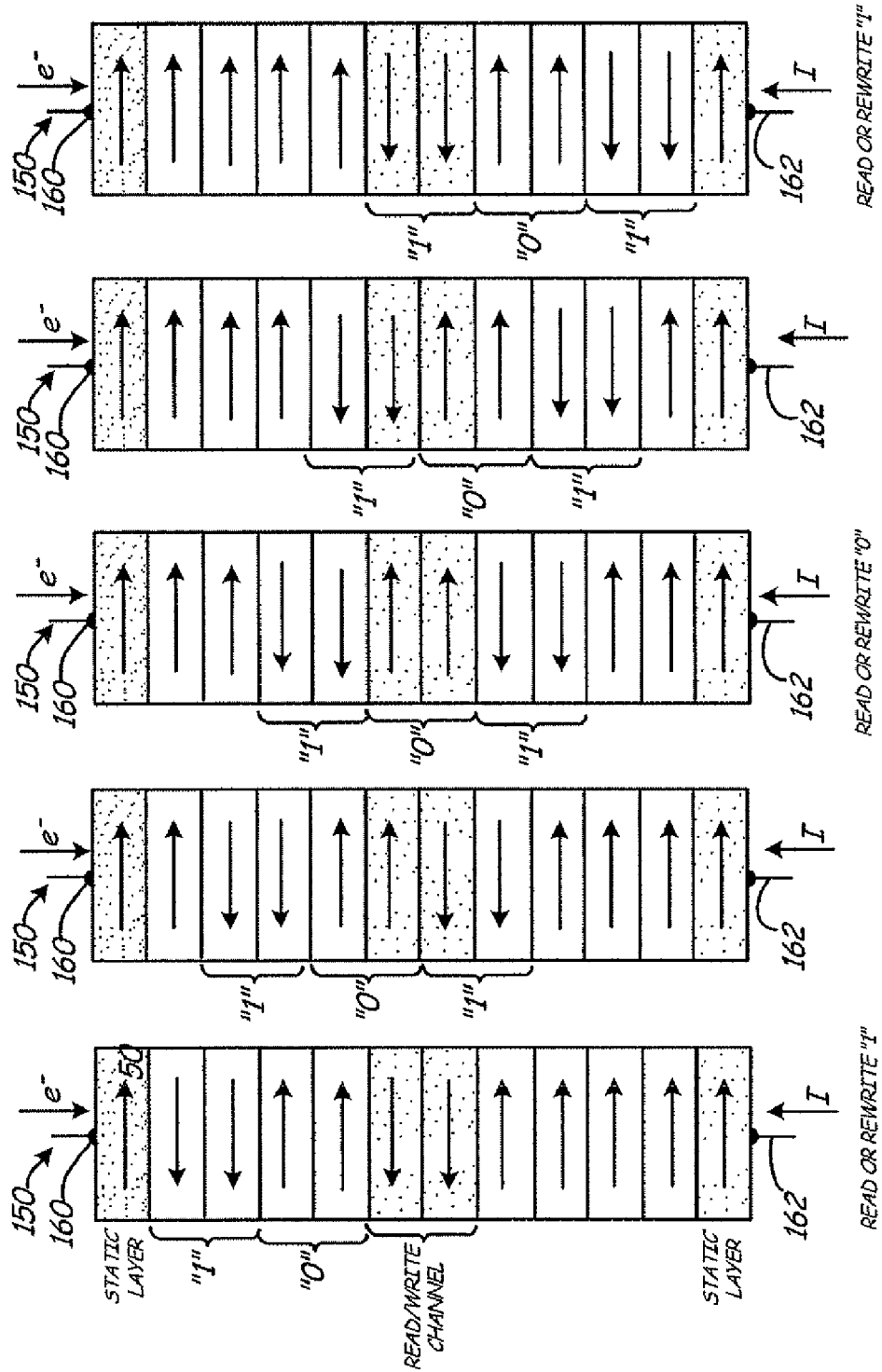
FIG. 12 shows the reverse propagation of a three bit sequence through the stack.

FIG. 12 is similar to FIG. 11 where the reverse propagation of the 3-bit sequence is shown to drive each bit through the read/write channel. FIG. 12 illustrates the use of the buffer locations, as the buffer locations are arranged such that all bits in the register 150 can be accessed at the read/write channel. Moving from left to right, an electrical current I is applied to move the bits downward into the buffer locations. The current I is turned off when a bit reaches the last buffer, framed by the bottom static layer. Excluding the read/write channel, there are typically at least the same number of buffers as there is number of locations.

Figure 13A:
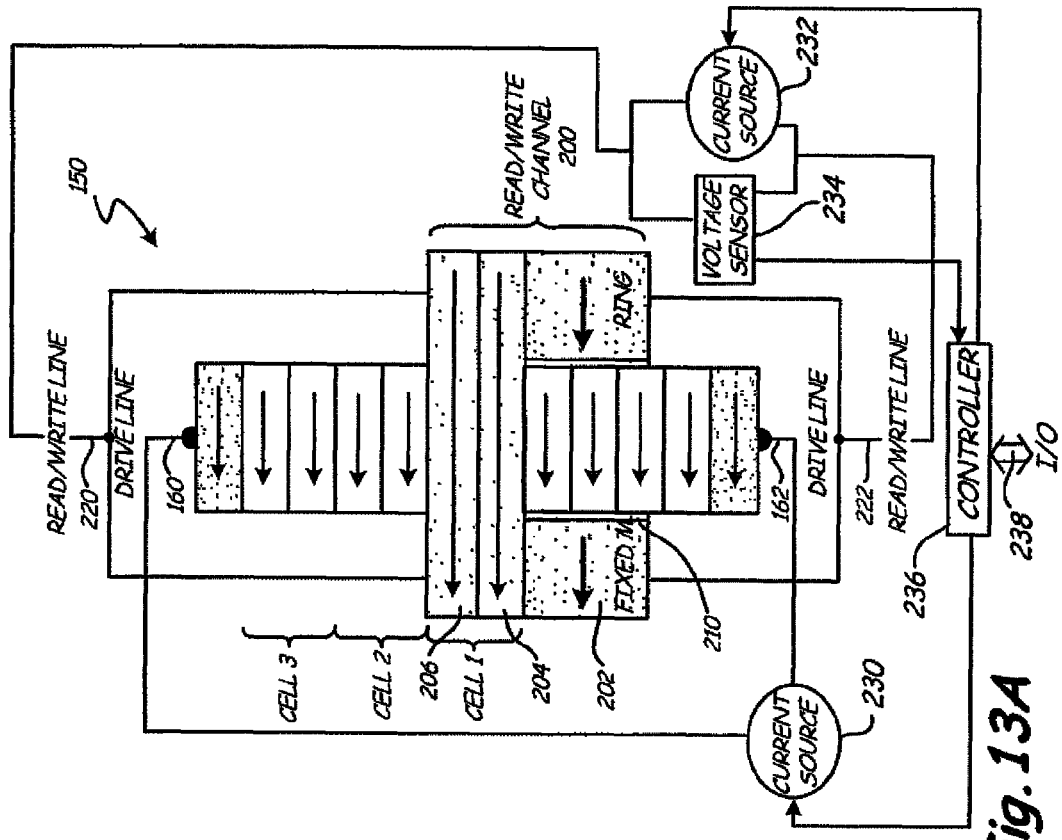
FIG. 13A is a diagram showing a read channel in the stack in more detail.
Figure 13B:
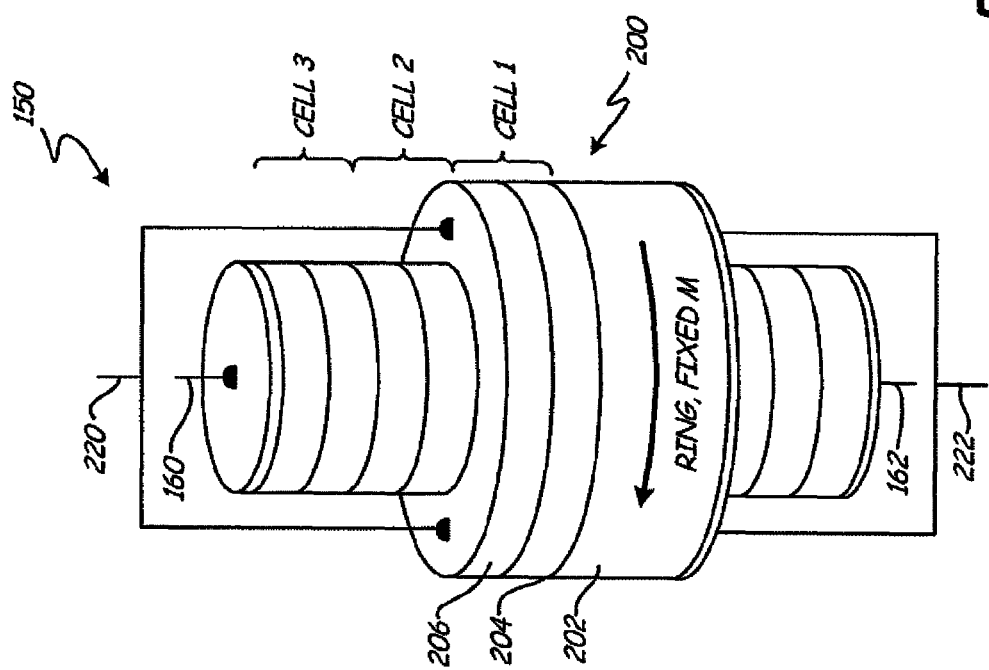
FIG. 13B is a perspective view of the stack illustrating the components of the read channel.

FIGS. 13A and 13B are more detailed depictions of a read/write channel 200 integrated with the stack 150, showing both a 2D cross-sectional view (FIG. 13A) and a perspective view (FIG. 13B). The read/write channel 200 is generally centered along the height of the stack 150, consisting of a magnetic layer 202 with fixed magnetization orientation and two free layers 204,206 that also form the first location, as discussed above. In this implementation, the fixed layer 202 is a magnetic ring concentric with the stack 150 and aligned vertically with the buffer layers. Electrical insulation 210 is positioned between the stack wall and the inner-ring wall such that current does not flow between them. However, the magnetic layers of cell-1 are in direct electrical contact with both the stack 150 and the ring 202. There are two electrodes 220,222 for the read/write channel, at the bottom of the ring and on top of cell-1, which are used both for the read and write processes.

FIG. 13A also shows a current source 230 arranged to control a current to cause the propagation of bits through the stack 150, as well as a current source 232 and a voltage sensor 234 associated with the read/write channel 200. During writing the current source 232 can be used to apply a sufficiently large current to the channel 200 to cause the data bit to be written. During readback, a smaller current level is applied to the channel 200 and the resultant voltage is sensed using voltage sensor 234. This voltage is related to the resistance across the location and therefore can be used to readback the stored data bits. A controller 236 is arranged to control reading and writing data under the stack 150 and is coupled to the current sources 230 and 232 and the voltage sensor 234. Controller 236 can be appropriate circuitry, including digital circuitry and coupled to the current sources 232 and the voltage sensor 234 using appropriate techniques. For example, controller 236 can include an analog to digital converter configured to convert a voltage drop across a resistor of voltage sensor 234 into a digital value. Controller 236 can be configured to store, readback and propagate bits through the stack 150 as discussed above. An input/output channel 238 is also shown coupled to the controller and can be used to write data to stack 150 or read data back from stack 150.

Figure 14:
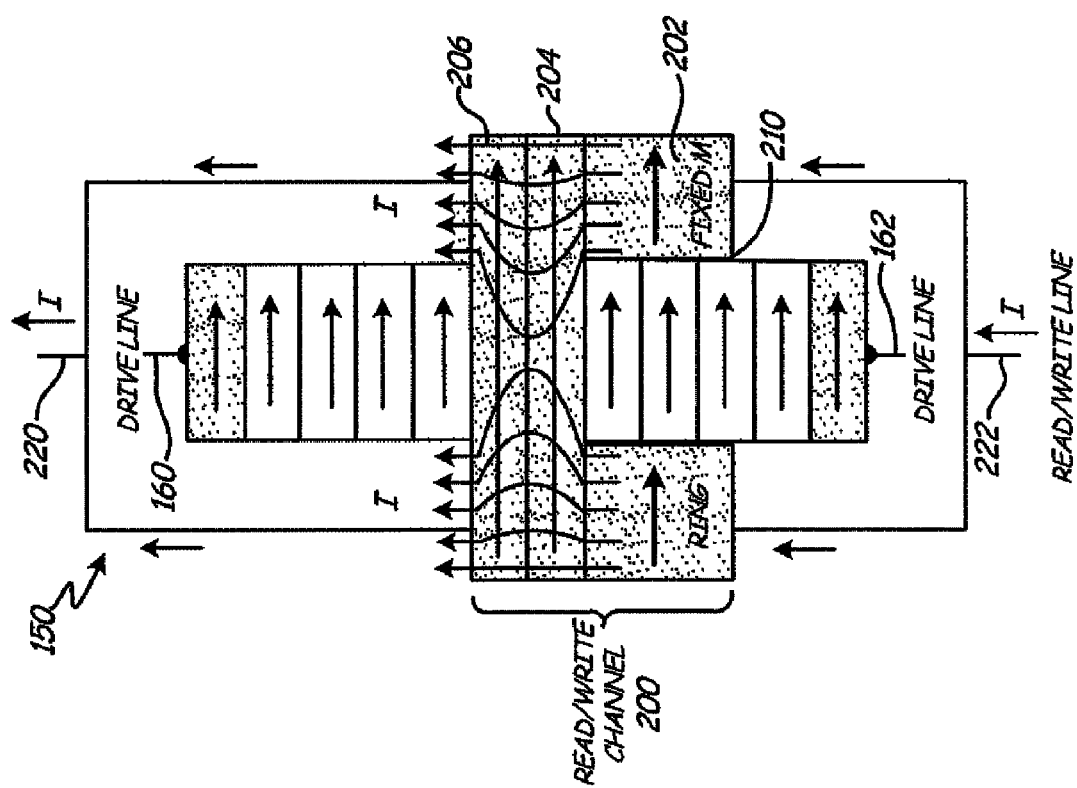
FIG. 14 is a diagram showing current flow through the read channel.

FIG. 14 illustrates the process of reading and writing a bit. The readout process requires applying a current level I sufficiently below the write threshold current to ensure that data is not written. One of two magnetoresistive outputs will be measured as illustrated in the R-I curve for FIG. 15. The two magnetization states are stable, and thus nonvolatile, and the reading process is non-destructive.

Figure 15:
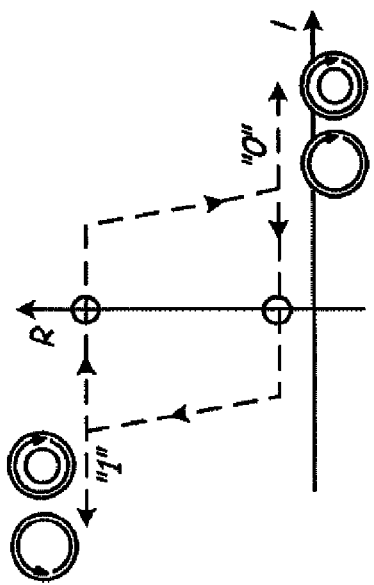
FIG. 15 is a graph showing resistance versus current of a cell.

The write process follows directly from the discussion of the two-layers system above where here the fixed ring is used to drive the magnetization of both layers of cell-1, either parallel or antiparallel, as shown in the graph of FIG. 15. Current spreading through cell 1, along with intrinsic exchange coupling in layers, results in uniform magnetization of free layers. The example of FIG. 15 shows a vortex magnetization, although the process is operable for other magnetization states that can be readily engineered by way of materials, geometry and structure (see, Nadjib Benatmane, Werner Scholz, and T. W. Clinton, "Magnetic Configurations and Phase Diagrams of sub-100 nm NiFe Nanorings", IEEE Trans. Magn. 43 (2007) 2884-2886). The surface area of the first location is larger than that of the fixed ring 202, because cell 1 is also a part of the memory stack 150 and, thus, must overlap with both. However, the magnetization of both layers of the location may be driven into a "uniform" magnetization state via SMT from the fixed ring 202 magnetization, as depicted in the graph of FIG. 15. In particular, current from the ring 202 will spread to the inner volume of the layers (at a lower density) such that a spin torque is applied over much of the location volume as shown in FIG. 14. Thus, the current density for magnetization switching will be larger than if the surfaces had complete overlap, but an R-I trace of FIG. 15 in the graph should be realizable. In addition, intrinsic exchange coupling in the layers will further try to drive the magnetization into a "uniform" configuration. Further, the relative dimensions of the fixed ring 202 and the first location can be engineered to optimize the switching operation.

Figure 16:
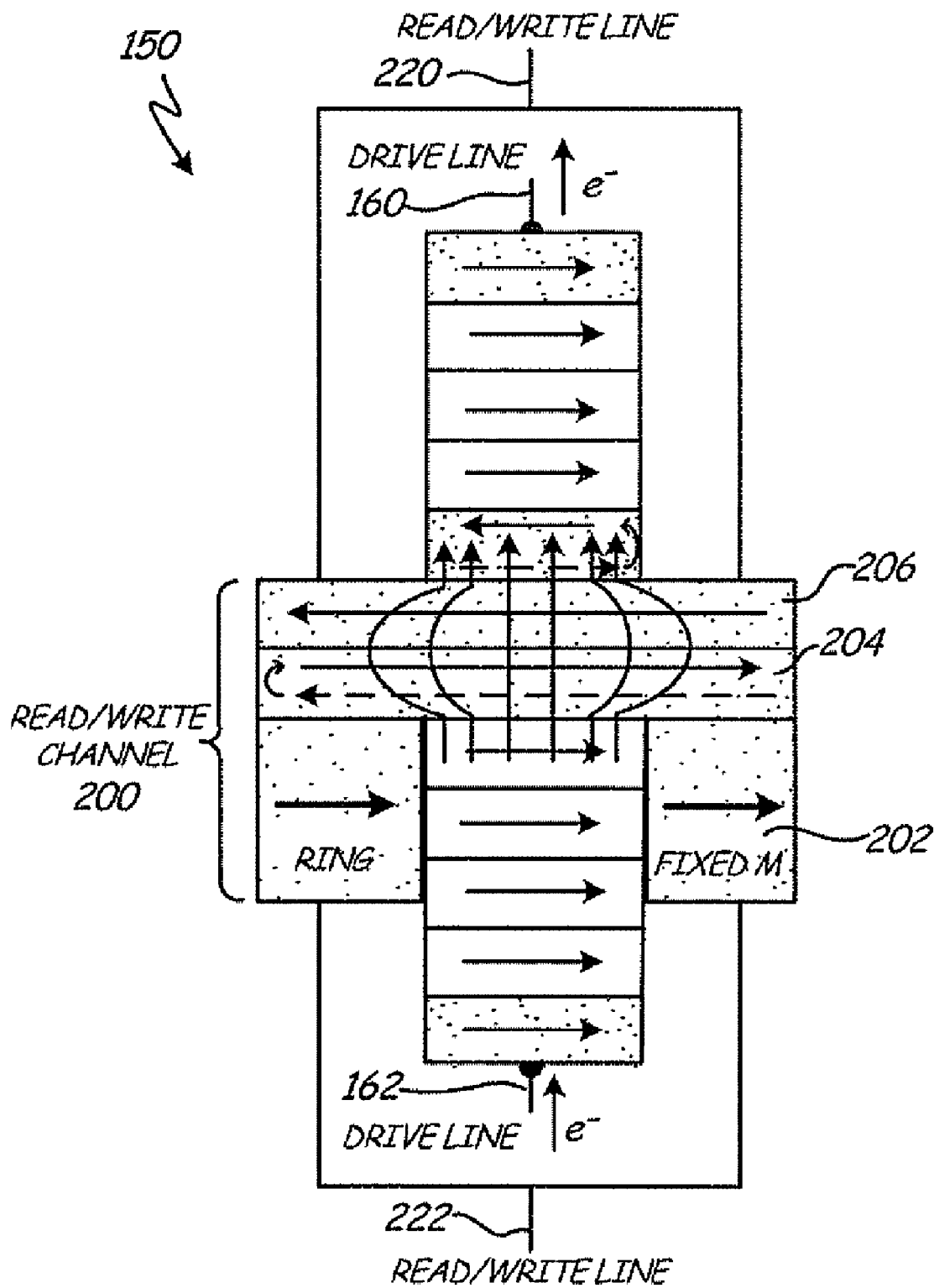
FIG. 16 is a diagram showing propagation of a bit through a first cell.

FIG. 16 is similar to that of FIG. 14, and illustrates propagation of a bit through the first location. Again, current spreading and intrinsic exchange coupling may make it possible to propagate a bit through the larger (area) layers of cell-1. Further, one layer of the location will be applying the torque to the other layer of the location that results in the bit propagation. Similar to the write process, the relative dimensions of the first location and adjacent locations can be engineered to optimize bit propagation.

Figure 17:
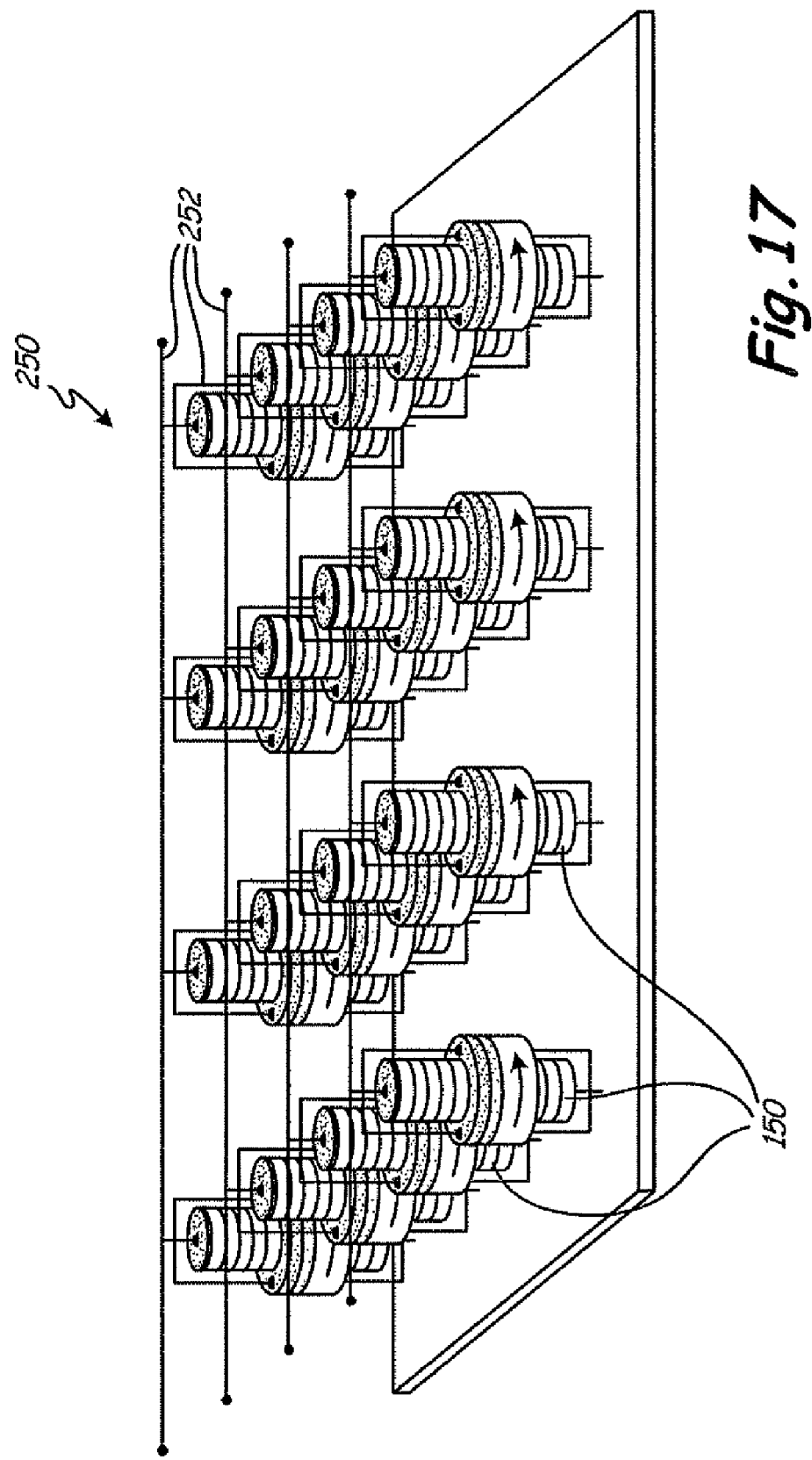
FIG. 17 shows an array of stacks to form a 3-D storage device.

FIG. 17 is a depiction of an array 250 of the shift registers 150 for a 3D storage device. Semiconductor techniques can be used to isolate and address individual registers, such as with a Field Effect Transistor (FET) while an appropriately designed array of electrical interconnects 252 makes it possible to access any individual register 150. In such a configuration, the controller 238, current sources 230,232 and voltage sensor 234 illustrated in FIG. 13A can be used to read and write data to the array.

The propagation rate of a bit, or the data rate can be estimated based on the known timescales for magnetization reversal in magnetic layers, which are of the order of nanosecond ($\tau \sim 10^{-9}$ s) but in principle can be faster. Thus, reading or writing of data may be achievable at data rates of the order of one gigahertz, and access times may be some multiple of the switching time $\tau$, depending upon the number of bits per stack and the degree of parallel accessing of data, i.e., a data set can be stored over multiple stacks and accessed in parallel since each stack has a read/write channel.

In this example, all of the magnetic layers are assumed to be GMR or TMR coupled to one another, or the like. For example, there is a non-magnetic interlayer (metal or tunnel barrier) between each magnetic layer to optimize spin momentum transfer between layers. The interlayer of the locations can vary and can be GMR or TMR based (metal or tunnel barrier, respectively). However, typically the same interlayer is employed throughout the location stack, for simplicity of manufacture. In the read/write channel, the interlayer between the reference layer and the free layer (cell-1) can be engineered separately from that of the locations, in particular, to optimize both the read amplitude and the write process. The interlayer coupling of magnetic multilayers is known in the field.

The designs discussed above are not inclusive, as there are other geometries that can be beneficial to the present invention that are not specifically discussed but are natural extension of the above. The free and fixed layers materials can be the typical transition metal ferromagnets such as Fe, Co, and Ni, or more exotic ferromagnetic materials, such as Heusler alloys, or the like. The interlayer can comprise a wide range of metals, such as Cu, as are typically used-in GMR devices. The interlayer can also comprise, for example, an insulating tunnel barrier, such as AlO, TaO, MgO, and others known in the field.

The present invention provides 3D magnetic memory with the potential for capacity comparable to or greater than a disk drive, but as a solid-state device it has advantages such as robustness, smaller footprint, shorter access times, faster random data access, and in some configurations, comparable or lower cost per bit. Features include the ability to propagate bits using spin momentum transfer, and a two-terminal integrated read and (SMT-based) write channel that permits shift register like access for reading, writing and storing of data.

Although the present invention has been described with reference to preferred embodiments, workers skilled in the art will recognize that changes may be made in form and detail without departing from the spirit and scope of the invention. As used herein the term memory location includes a magnetic layer and a proximate non-magnetic layer. The layers may or may not be in direct contact or may optionally include additional layers. A particular non-magnetic layer may be positioned on either side of a magnetic layer. As used herein, "a memory location" includes memory locations in the read/write channel, and buffer locations. Further, the term "transducer" includes a current source and/or a sensor configured to sense resistance of the read/write channel.

What is claimed is:

1. An apparatus comprising:
   a single pinned layer with a fixed magnetic orientation; and
   a plurality of stacked memory locations coupled to the single pinned layer each including a switchable magnetic layer having a first and a second resistance state, each said state established in relation to a magnetic orientation of the switchable magnetic layer relative to the fixed magnetic orientation of the single pinned layer.

2. The apparatus of claim 1 wherein each of the plurality of memory locations include a non-magnetic layer.

3. The apparatus of claim 2 wherein the nonmagnetic layer comprises a layer selected from the group of layers consisting of an insulator layer, a semiconductor layer, and a metal layer.

4. The apparatus of claim 1 wherein each of the plurality of memory locations further comprises a tunneling layer, the respective switchable magnetic layers and the tunneling layers of said plurality of memory locations alternately arranged in a semiconductor memory cell stack on the single pinned layer.

5. The apparatus of claim 1 wherein the switchable magnetic layer is selected from the group of layers consisting of a magnetic layer proximate to an antiferromagnetic layer, a high anisotropy layer, and a synthetic antiferromagnetic layer.

6. The apparatus of claim 3 wherein the switchable magnetic layer comprises a magnetic layer adjacent a high anisotropy layer.

7. The apparatus of claim 1 including a controller configured to control a current source configured to provide a recording current to the memory locations and thereby switch at least one of the plurality of switchable magnetic layers from the first resistance state to the second resistance state and thereby store a digital value.

8. The apparatus of claim 1 in which the stack has a first overall width and the pinning layer has a second greater width.

9. The apparatus of claim 1 wherein the pinned layer is selected from the group of layers consisting of a magnetic layer adjacent an antiferromagnetic layer, a high anisotropy layer, and a synthetic antiferromagnetic layer.

10. The apparatus of claim 1 further comprising a sensor configured to sense a resistance of at least one of the plurality of memory locations and thereby retrieve a stored digital value.

11. A method of storing data, comprising:
    providing a memory cell with a single pinned layer having a fixed magnetic orientation and a plurality of stacked memory locations coupled to the single pinned layer, each memory location including a switchable magnetic layer having a first and a second resistance state, each said state established in relation to a magnetic orientation of the switchable magnetic layer relative to the fixed magnetic orientation of the single pinned layer;
    applying a first current through the plurality of memory locations to cause at least one of the plurality of memory locations to obtain a first electrical resistance level and thereby store a digital value; and
    sensing a resistance of at least one of the plurality of memory locations and thereby retrieving the stored digital value.

12. The method of claim 11 wherein sensing a resistance includes applying a second current level and wherein the first and second current levels are different.

13. The method of claim 11 including applying a second current level to the plurality of memory locations and causing the plurality of memory locations to attain a second electrical resistance value.

14. The method of claim 11 where first the resistance value is measured and this value is used in determining a series of current value needed to reach a desired final state.

15. The method of claim 11 including applying a resetting current to set the switchable layers to a known state prior to applying current to write a data bit.

16. The method of claim 11 wherein a block of data bits is written to a plurality of stacked memory locations all at once.

17. The method of claim 11 wherein each of the plurality of memory locations further comprises a layer selected from the group of layers consisting of an insulator layer, a semiconductor layer, and a metal layer.

18. The method of claim 11 wherein the switchable magnetic layer is selected from the group of layers consisting of a magnetic layer proximate to an antiferromagnetic layer, and a high anisotropy layer, a synthetic antiferromagnetic layer.

19. The method of claim 13 further comprising providing the first and second currents from a current source.

20. The method of claim 11 including switching each of the plurality of stacked memory locations between two resistive states.

21. A method of storing data, comprising:
    providing a memory cell with a single pinned layer having a fixed magnetic orientation and a plurality of stacked memory locations coupled to the single pinned layer, each memory location including a switchable magnetic layer having a first and a second resistance state, each said state established in relation to a magnetic orientation of the switchable magnetic layer relative to the fixed magnetic orientation of the single pinned layer;

writing data to a read/write channel in the plurality of stacked memory locations; and causing the data written to the read/write channel to propagate to an adjacent memory location in the plurality of stacked memory locations.

22. The method of claim 21 including providing a transducer to read and write data to the read/write channel.

23. The method of claim 21 including sensing resistance of the read/write channel to read back data.

24. The method of claim 21 including providing a current source coupled to opposite ends of the stacked magnetic memory locations to propagate the data to an adjacent location.

25. The method of claim 21 wherein at least one location of the plurality of stacked magnetic memory locations has at least two stable magnetic states.

26. The method of claim 21 including propagating the written data to a buffer location.

27. A semiconductor memory cell, having a plurality of switchable magnetic layers with selectively variable magnetic orientations each magnetically coupled to a single pinned layer having a fixed magnetic orientation, wherein the respective switchable magnetic layers are switched between a parallel configuration and an antiparallel configuration relative to the fixed magnetic orientation of the pinned layer to set an overall electrical resistance of the memory cell.

28. The memory cell of claim 27, characterized as a stack of the switchable magnetic layers with tunneling barriers interposed therebetween, wherein a spin torque is induced in a current passed through the single pinned layer and passed through each of the switchable magnetic layers to change the respective magnetic orientation of each said magnetic layer.

29. The memory cell of claim 27, wherein the switchable magnetic layers have a first overall diameter in a direction perpendicular to a direction of current flow through the memory cell, and the pinned layer has a second overall diameter in a direction perpendicular to said direction of current flow greater than the first overall diameter.

* * * * *

UNITED STATES PATENT AND TRADEMARK OFFICE
CERTIFICATE OF CORRECTION

| | | |
|---|---|---|
| PATENT NO. | : 7,936,597 B2 | Page 1 of 1 |
| APPLICATION NO. | : 12/054775 | |
| DATED | : May 3, 2011 | |
| INVENTOR(S) | : Thomas W. Clinton et al. | |

It is certified that error appears in the above-identified patent and that said Letters Patent is hereby corrected as shown below:

On title page, item 75 Inventors,
replace "Mark W. Convington"
with "Mark W. Covington".

Signed and Sealed this
Fifth Day of July, 2011

David J. Kappos
*Director of the United States Patent and Trademark Office*